United States Patent
Tahara et al.

(10) Patent No.: US 12,249,515 B2
(45) Date of Patent: Mar. 11, 2025

(54) ETCHING METHOD AND ETCHING APPARATUS

(71) Applicants: Tokyo Electron Limited, Tokyo (JP); UNIVERSITE D'ORLEANS, Orleans (FR)

(72) Inventors: Shigeru Tahara, Miyagi (JP); Jacques Faguet, Austin, TX (US); Kaoru Maekawa, Albany, NY (US); Kumiko Ono, Tokyo (JP); Nagisa Sato, Tokyo (JP); Remi Dussart, Saint-Pryve Saint-Mesmin (FR); Thomas Tillocher, Orleans (FR); Philippe Lefaucheux, Mareau-aux-pres (FR); Gaëlle Antoun, Dardilly (FR)

(73) Assignees: Tokyo Electron Limited, Tokyo (JP); UNIVERSITE D'ORLEANS, Orleans (FR)

( * ) Notice: Subject to any disclaimer, the term of this patent is extended or adjusted under 35 U.S.C. 154(b) by 196 days.

(21) Appl. No.: 17/547,238

(22) Filed: Dec. 10, 2021

(65) Prior Publication Data

US 2022/0102160 A1   Mar. 31, 2022

Related U.S. Application Data

(63) Continuation of application No. PCT/JP2020/021769, filed on Jun. 2, 2020.

(30) Foreign Application Priority Data

Jun. 13, 2019   (JP) .................. 2019-109990

(51) Int. Cl.
*H01L 21/311* (2006.01)
*H01J 37/32* (2006.01)
(Continued)

(52) U.S. Cl.
CPC .. *H01L 21/31116* (2013.01); *H01J 37/32449* (2013.01); *H01J 37/32522* (2013.01);
(Continued)

(58) Field of Classification Search
None
See application file for complete search history.

(56) References Cited

U.S. PATENT DOCUMENTS

2017/0372916 A1* 12/2017 Kudo ............... H01J 37/32091
2018/0174860 A1*  6/2018 Kanarik ............ H01L 21/0228

FOREIGN PATENT DOCUMENTS

JP   2015-173240 A   10/2015
WO  2017/213193 A1  12/2017

OTHER PUBLICATIONS

C. Li et al., "Fluorocarbon based atomic layer etching of Si3N4 and etching selectivity of SiO2 over Si3N4", J. Vac. Sci. Technol. A, vol. 34(4), paper#041307. (Year: 2016).*

(Continued)

*Primary Examiner* — Jiong-Ping Lu
(74) *Attorney, Agent, or Firm* — XSENSUS LLP

(57) ABSTRACT

An etching method includes: a physical adsorption process of physically adsorbing an adsorbate based on a first processing gas on a film to be etched under a condition that the pressure of the first processing gas is smaller than the saturated vapor pressure of the first processing gas with respect to a temperature of an object to be processed while cooling the object to be processed on which the film to be etched is formed; and an etching process of etching the film to be etched by reacting the adsorbate with the film to be etched by a plasma of a second processing gas.

16 Claims, 7 Drawing Sheets

(51) Int. Cl.
*H01L 21/3065* (2006.01)
*H01L 21/3213* (2006.01)

(52) U.S. Cl.
CPC .... *H01L 21/3065* (2013.01); *H01L 21/30655* (2013.01); *H01L 21/32136* (2013.01); *H01J 37/32834* (2013.01); *H01J 2237/3341* (2013.01)

(56) References Cited

OTHER PUBLICATIONS

G. S. Oehrlein, et al., "Atomic Layer Etching at the Tipping Point: An Overview", ECS Journal of Solid State Science and Technology, 4 (6) N5041-N5053, Mar. 27, 2015.

* cited by examiner

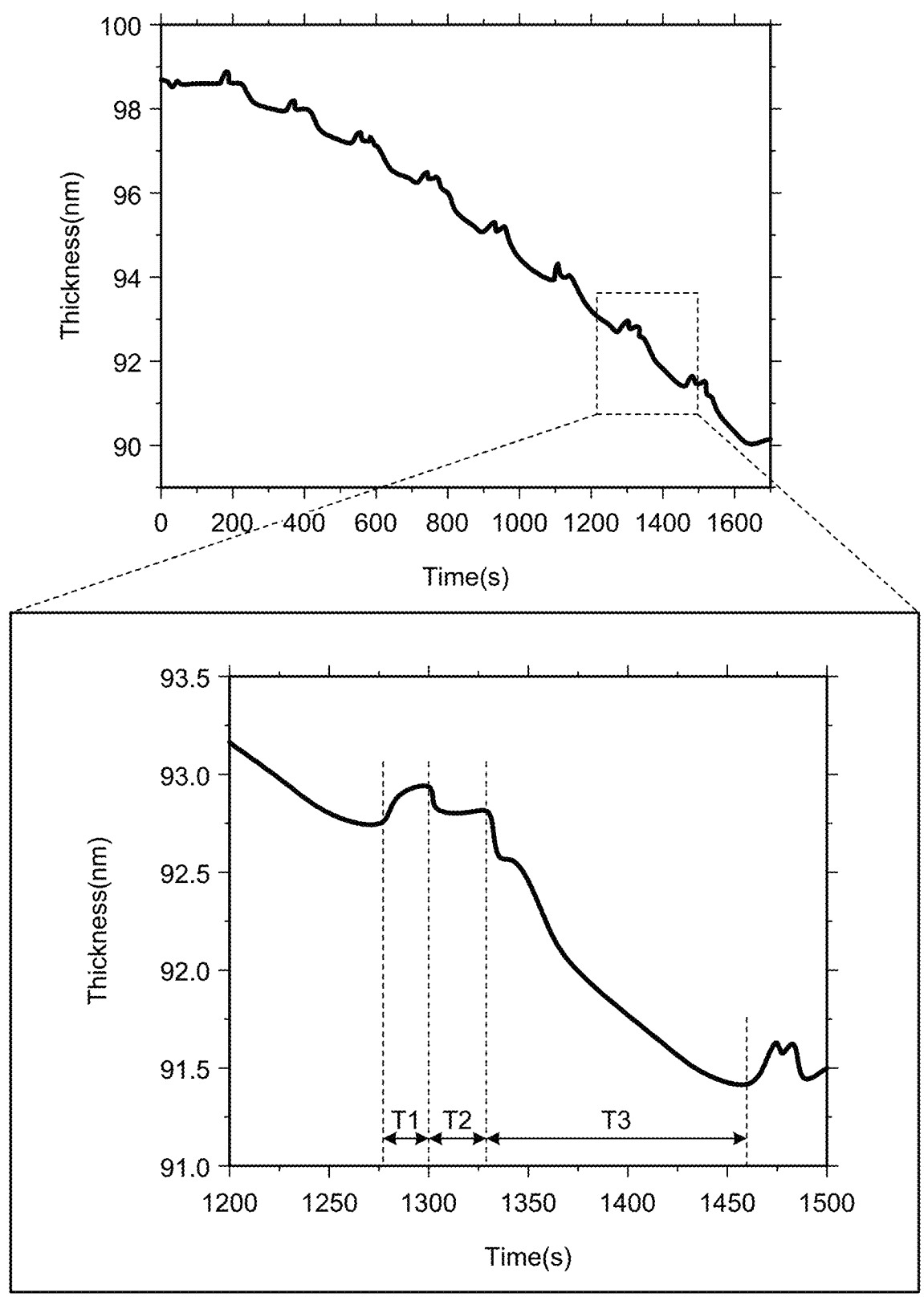

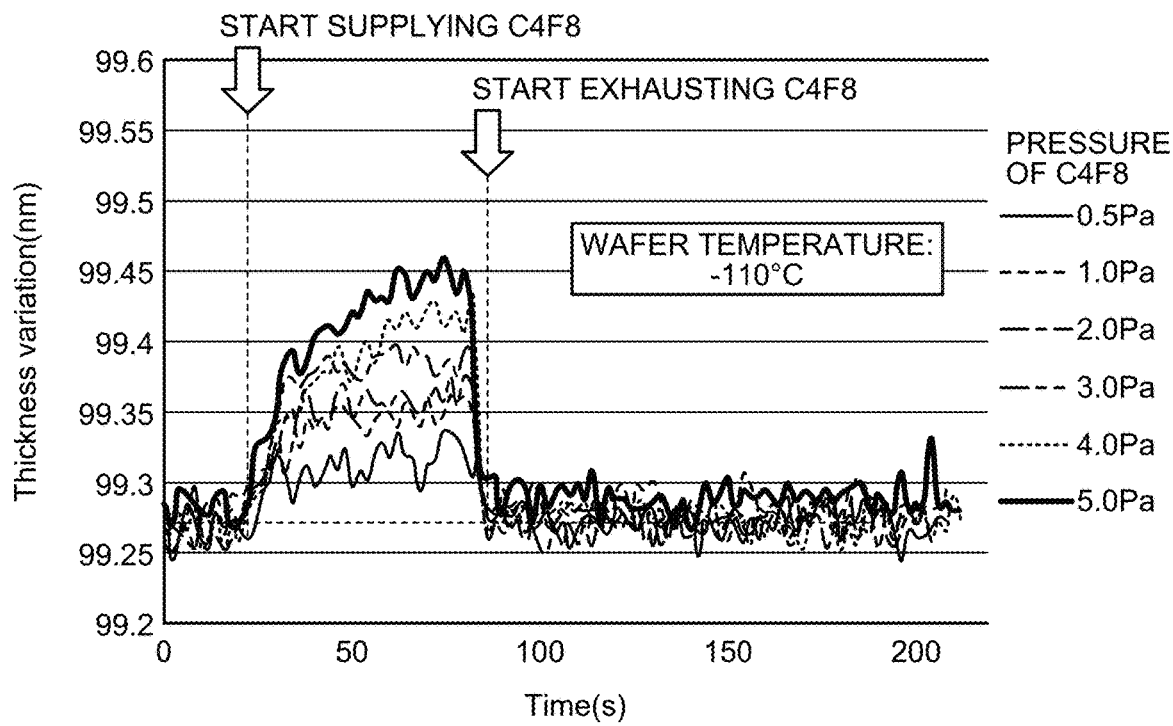
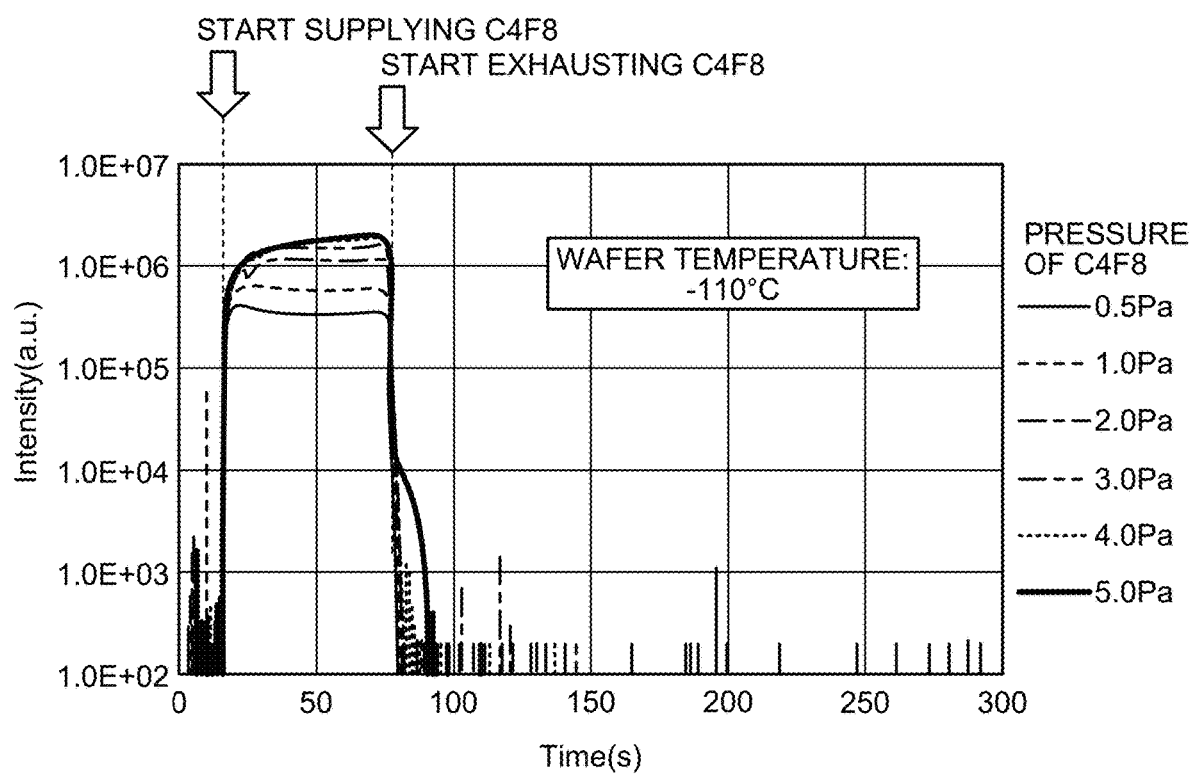

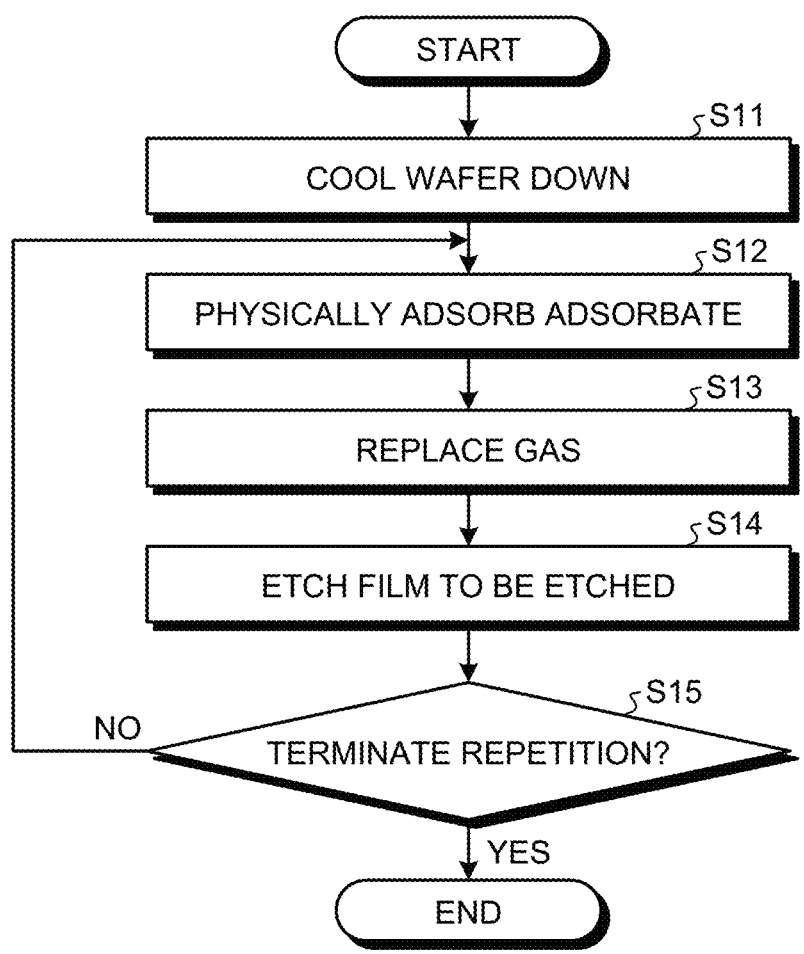

ETCHING METHOD AND ETCHING APPARATUS

CROSS-REFERENCE TO RELATED APPLICATIONS

This application is a continuation application of International Application PCT/JP2020/021769, filed on Jun. 2, 2020 and claims priority to Japanese Application No. 2019-109990, filed Jun. 13, 2019, the entire contents of each are incorporated herein by reference.

FIELD

The present disclosure relates to an etching method and an etching apparatus.

BACKGROUND

The technique called the Quasi-atomic layer etching (ALE) method is known as one of the techniques for etching a film to be etched. The Quasi-ALE method etches a film to be etched by depositing a polymer layer based on a processing gas on the film to be etched and reacting the polymer layer with the film to be etched by a plasma of a rare gas (see, for example, Patent Literature 1).
Patent Literature 1: JP 2015-173240 A The present disclosure provides a technique that can appropriately control an etching amount.

SUMMARY

In an embodiment of a present disclosure, an etching method includes: a physical adsorption process of physically adsorbing an adsorbate based on a first processing gas on a film to be etched under a condition that the pressure of the first processing gas is smaller than the saturated vapor pressure of the first processing gas with respect to a temperature of an object to be processed while cooling the object to be processed on which the film to be etched is formed; and an etching process of etching the film to be etched by reacting the adsorbate with the film to be etched by a plasma of a second processing gas.

BRIEF DESCRIPTION OF DRAWINGS

FIG. 3 is a diagram illustrating an example of temporal changes in the film thickness of a wafer according to the embodiment.

FIG. 4 is a graph illustrating the result of measuring temporal changes in the thickness of an adsorbate on an SiO2 film by an ellipsometer when the temperature of the wafer is −110° C.

FIG. 5 is a graph illustrating the result of measuring temporal changes in the intensity of a gas component near the SiO2 film by QMS when the temperature of the wafer is −110° C.

FIG. 10 is a flowchart illustrating an example of a flow of an etching method according to the embodiment.

DESCRIPTION OF EMBODIMENT

Figure 1:
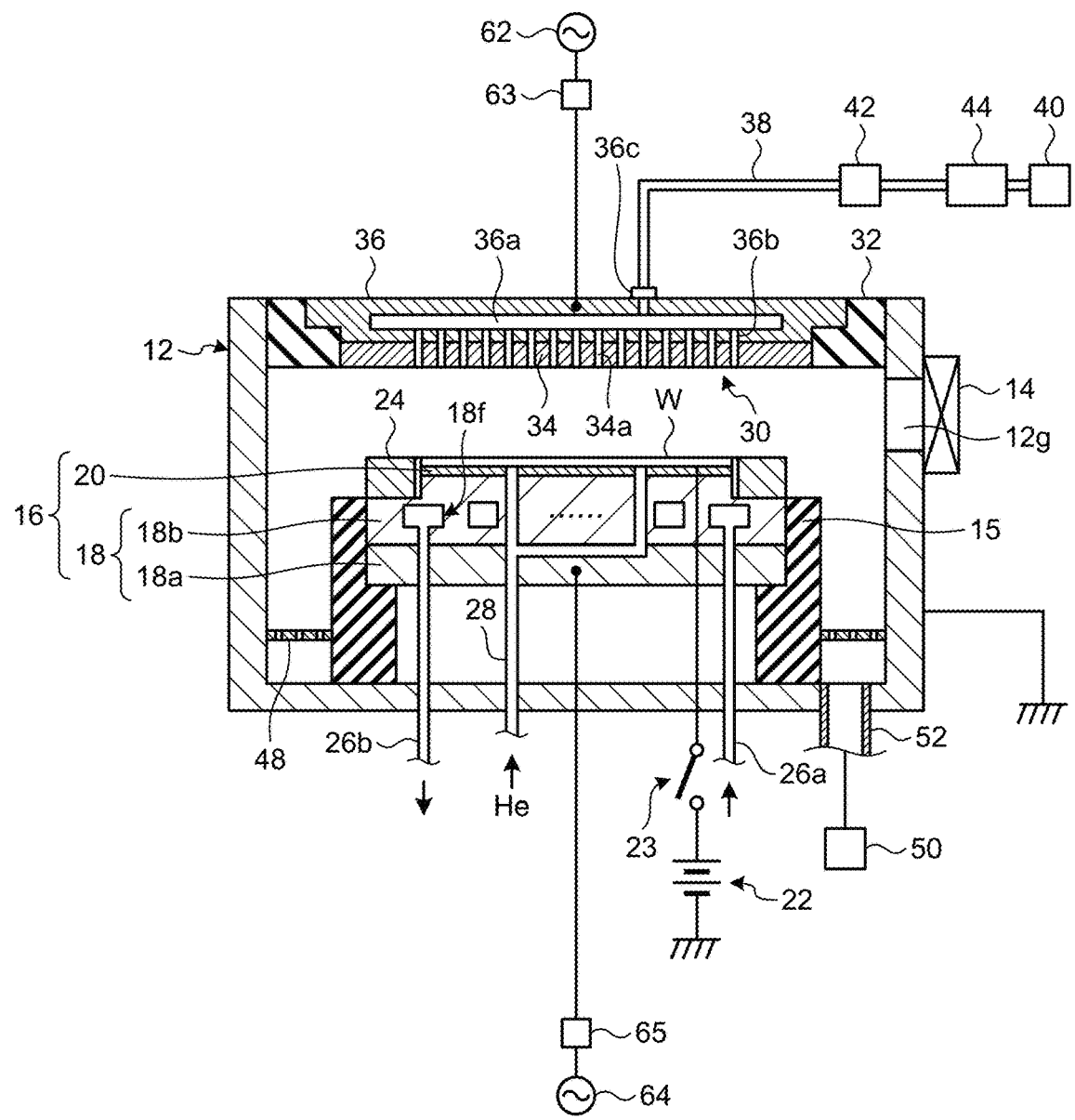
FIG. 1 is a diagram schematically illustrating an example of a cross section of an etching apparatus according to an embodiment.

Various embodiments will be described below in detail with reference to the drawings. Note that the same reference numerals shall be used for the same or corresponding portions of the drawings.

In the Quasi-ALE method, when a polymer layer based on a processing gas is deposited on a film to be etched, the deposition amount of the polymer layer deposited on the film to be etched tends to increase linearly with the lapse of time. When the deposition amount of the polymer layer deposited on the film to be etched increases linearly with the lapse of time, it is difficult to control the thickness of the polymer layer in atomic layer units. Thus, the Quasi-ALE method has a problem that it is difficult to appropriately control the etching amount of the film to be etched by reacting with the polymer layer.

Configuration of Etching Apparatus

An etching apparatus according to an embodiment will first be described with reference to FIG. 1. FIG. 1 is a diagram schematically illustrating an example of a cross section of an etching apparatus 10 according to the embodiment. The etching apparatus 10 illustrated in FIG. 1 is a capacitive coupling type etching apparatus.

The etching apparatus 10 includes a chamber 12. The chamber 12 has a substantially cylindrical shape. The chamber 12 provides its internal space as a processing space. The chamber 12 has a film having plasma resistance formed on its inner wall surface. The film can be an alumite film or a film formed of yttrium oxide. The chamber 12 is grounded. The chamber 12 has an opening 12g formed on its side wall. When a wafer W is carried in from the outside of the chamber 12 to the chamber 12 and when the wafer W is carried out from the chamber 12 to the outside of the chamber 12, the wafer W passes through the opening 12g. A gate valve 14 is attached to the side wall of the chamber 12 for opening and closing the opening 12g.

A support portion 15 is provided on the bottom of the chamber 12. The support portion 15 has a substantially cylindrical shape. The support portion 15 is made of, for example, an insulating material. The support portion 15 extends upward from the bottom portion of the chamber 12 in the chamber 12. A stage 16 is provided in the chamber 12. The stage 16 is supported by the support portion 15.

The stage 16 is used to place a semiconductor wafer (hereinafter referred to as a "wafer W"). The wafer W is an example of an object to be processed. The stage 16 has a lower electrode 18 and an electrostatic chuck 20. The lower electrode 18 includes a first plate 18a and a second plate 18b. The first plate 18a and the second plate 18b are made of, for example, a metal such as aluminum, and have a substantially disk-like shape. The second plate 18b is provided on the first plate 18a and electrically connected to the first plate 18a.

The electrostatic chuck 20 is provided on the second plate 18b. The electrostatic chuck 20 has an insulating layer and a film-like electrode provided in the insulating layer. A DC power source 22 is electrically connected to the electrode of the electrostatic chuck 20 via a switch 23. A DC voltage is applied to the electrode of the electrostatic chuck 20 from the DC power source 22. When a DC voltage is applied to the electrode of the electrostatic chuck 20, the electrostatic chuck 20 generates an electrostatic attractive force to attract the wafer W to the electrostatic chuck 20 and hold the wafer W. A heater may be built in the electrostatic chuck 20, and a heater power source provided outside the chamber 12 may be connected to the heater.

The second plate 18b is provided with a focusing ring 24 on its peripheral edge. The focusing ring 24 is a substantially annular plate. The focusing ring 24 is disposed to surround the edge of the wafer W and the electrostatic chuck 20. The focusing ring 24 is provided to improve etching uniformity. The focusing ring 24 can be formed of, for example, a material such as silicon or quartz.

A flow channel 18f is provided inside the second plate 18b. A refrigerant is supplied to the flow channel 18f from a chiller unit provided outside the chamber 12 through a pipe 26a. The refrigerant supplied to the flow channel 18f is returned to the chiller unit through the pipe 26b. In other words, the refrigerant is circulated between the flow channel 18f and the chiller unit. The control of the temperature of the refrigerant allows the temperature of the stage 16 (or the electrostatic chuck 20) and the temperature of the wafer W to be adjusted. Examples of the refrigerant include, for example, Galden (registered trademark).

The etching apparatus 10 is provided with a gas supply line 28. The gas supply line 28 supplies a heat transfer gas from a heat transfer gas supply mechanism, for example, He gas, between the upper surface of the electrostatic chuck 20 and the rear surface of the wafer W.

The etching apparatus 10 further includes an upper electrode 30. The upper electrode 30 is provided above the stage 16. The upper electrode 30 is supported on the upper portion of the chamber 12 through a member 32. The upper electrode 30 can include an electrode plate 34 and a support body 36. The lower surface of the electrode plate 34 faces the chamber 12. The electrode plate 34 is provided with a plurality of gas discharge holes 34a. The electrode plate 34 can be formed of a material such as silicon or silicon oxide.

The support body 36 detachably supports the electrode plate 34 and is formed of a conductive material such as aluminum. A gas diffusion chamber 36a is provided inside the support body 36. From the gas diffusion chamber 36a, a plurality of gas flow holes 36b communicating with the gas discharge holes 34a extends downward. The support body 36 is formed with a gas introduction port 36c for introducing gas into the gas diffusion chamber 36a. A gas supply pipe 38 is connected to the gas introduction port 36c.

A gas source group 40 is connected to the gas supply pipe 38 through a valve group 42 and a flow volume controller group 44. The gas source group 40 includes a plurality of gas sources. The plurality of gas sources includes at least a gas source of the first processing gas and a gas source of the second processing gas. The first processing gas is a gas physically adsorbed on the film to be etched on the wafer W. The second processing gas is a gas used for etching the film to be etched. The plurality of gas sources may include gas sources other than the first processing gas and the second processing gas.

The valve group 42 includes a plurality of valves, and the flow volume controller group 44 includes a plurality of flow volume controllers such as mass flow controllers or pressure-controlled flow volume controllers. Each of the plurality of gas sources of the gas source group 40 is connected to the gas supply pipe 38 via a corresponding valve of the valve group 42 and a corresponding flow volume controller of the flow volume controller group 44.

A baffle member 48 is provided between the support portion 15 and the side wall of the chamber 12. The baffle member 48 is, for example, a plate-like member and can be formed by coating the surface of an aluminum base material with ceramics such as Y2O3. The baffle member 48 is formed with a plurality of holes penetrating the baffle member 48. Below the baffle member 48, an exhaust device 50 is connected to the bottom of the chamber 12 via an exhaust pipe 52. The exhaust device 50 has a pressure controller, such as a pressure regulating valve, and a vacuum pump, such as a turbomolecular pump, and can depressurize the chamber 12 to a desired pressure.

The etching apparatus 10 further includes a first high-frequency power source 62 and a second high-frequency power source 64. The first high-frequency power source 62 is a power source for generating first high-frequency power (high-frequency electric energy) for generating plasma. The first high-frequency power has a frequency in the range of, for example, 27 to 100 MHz. The first high-frequency power source 62 is connected to the upper electrode 30 via a matching unit 63. The matching unit 63 has a circuit for matching the output impedance of the first high-frequency power source 62 with the impedance on the load side (upper electrode 30 side). The first high-frequency power source 62 may be connected to the lower electrode 18 via the matching unit 63.

The second high-frequency power source 64 is a power source for generating second high-frequency power (high-frequency electric energy) for drawing ions into the wafer W. The second high-frequency power has a frequency in the range of, for example, 400 kHz to 13.56 MHz. The second high-frequency power source 64 is connected to the lower electrode 18 via a matching unit 65. The matching unit 65 has a circuit for matching the output impedance of the second high-frequency power source 64 with the impedance on the load side (lower electrode 18 side).

The operation of the etching apparatus 10 is integrally controlled by a control unit 70. The control unit 70 is provided with a process controller 71 including a CPU (Central Processing Unit) and controlling each part of the etching apparatus, a user interface 72, and a storage 73.

The user interface 72 is constituted of a keyboard on which a process manager inputs a command to control the etching apparatus, and a display for visualizing and displaying the operation state of the etching apparatus, for example.

The storage 73 stores a control program (software) for realizing various processes executed by the etching apparatus under the control of the process controller 71 and a recipe storing processing condition data and other data. Recipes such as control programs and processing condition data may be stored in a computer-readable computer recording medium (e.g., a hard disk, a CD, a flexible disk and a semiconductor memory). Recipes such as control programs and processing condition data may be transmitted from other devices at any time, for example, via a dedicated line.

The control unit 70 controls the operation of the entire apparatus by the process controller 71 operating based on the control program and the processing condition data stored in the storage 73.

Etching Method

An example of the flow of etching the wafer W by the etching apparatus 10 will then be described. The etching apparatus 10 first performs a physical adsorption process. In other words, the etching apparatus 10 physically adsorbs the adsorbate based on the first processing gas on the film to be etched under the condition that the pressure of the first processing gas is smaller than the saturated vapor pressure of the first processing gas with respect to the temperature of the wafer W while cooling the wafer W on which a film to be etched is formed. The etching apparatus 10 then performs an etching process. In other words, the etching apparatus 10 etches the film to be etched by reacting the adsorbate with the film to be etched by the plasma of the second processing gas. The film to be etched is, for example, a silicon-containing film. Examples of the silicon-containing film include an SiO2 film. The first processing gas is, for example, a CF-based gas. Examples of the CF-based gas include C4F8. The second processing gas is, for example, a rare gas. Examples of the rare gas include Ar. The physical adsorption process and the etching process may be repeated for a plurality of cycles. A replacement process of replacing the first processing gas with a third processing gas may be performed between the physical adsorption process and the etching process. The third processing gas may be identical to, for example, the second processing gas.

In the Quasi-ALE method, which is one of the techniques for etching a film to be etched, when a polymer layer based on a processing gas is deposited on the film to be etched, the deposition amount of the polymer layer deposited on the film to be etched tends to increase linearly with the lapse of time. When the deposition amount of the polymer layer deposited on the film to be etched increases linearly with the lapse of time, it is difficult to control the thickness of the polymer layer in atomic layer units. Thus, the Quasi-ALE method has a problem that it is difficult to control the etching amount of the film to be etched by reacting with the polymer layer to a desired amount.

Therefore, the etching apparatus 10 physically adsorbs the adsorbate based on the first processing gas on the film to be etched under the condition that the pressure of the first processing gas is smaller than the saturated vapor pressure of the first processing gas with respect to the temperature of the wafer W while cooling the wafer W on which the film to be etched is formed. Physically adsorbing the adsorbate on the film to be etched under the condition that the pressure of the first processing gas is smaller than the saturated vapor pressure while cooling the wafer W allows the adsorption amount of the adsorbate to be saturated to a constant value with the lapse of time, so that the thickness of the adsorbate can be controlled with high accuracy in atomic layer units. Thus, the etching amount of the film to be etched by reacting with the adsorbate can be appropriately controlled to a desired amount.

Figure 2:
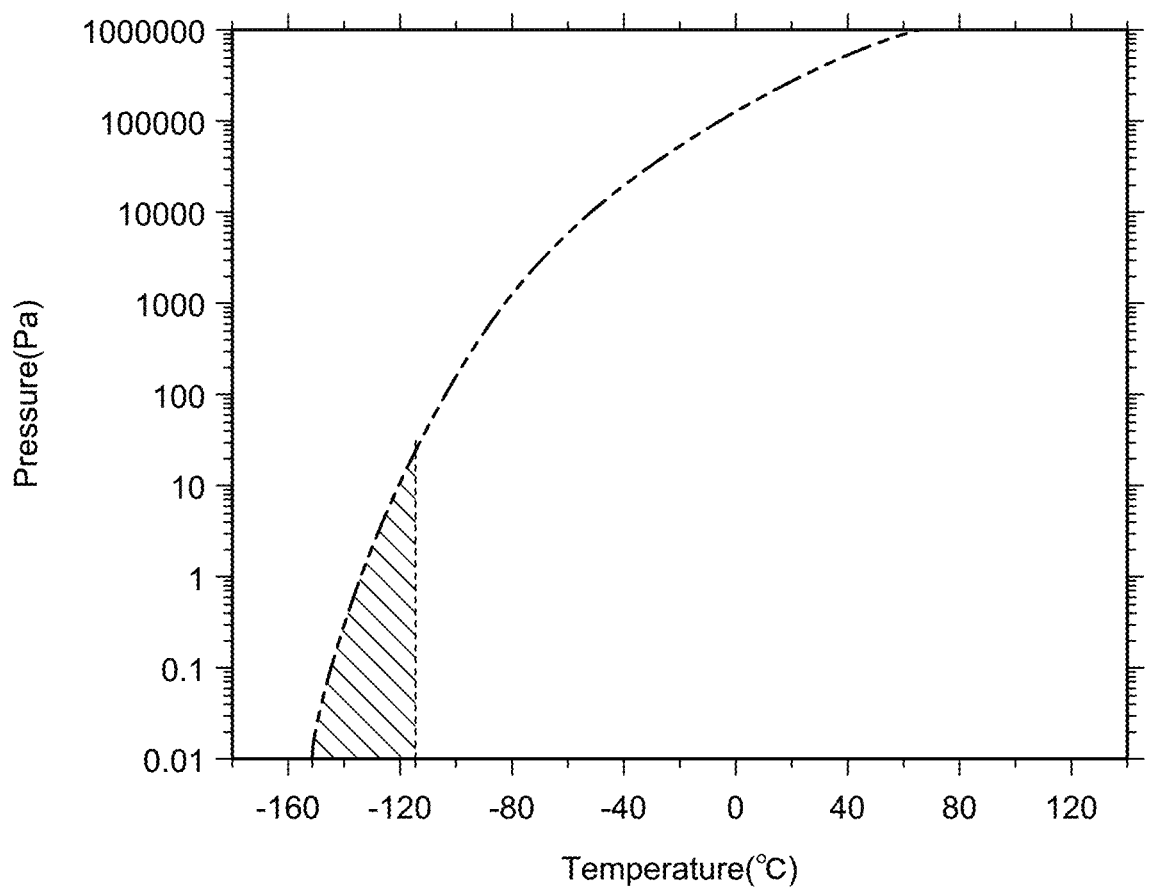
FIG. 2 is a diagram illustrating an example of a vapor pressure curve of a first processing gas according to the embodiment.

FIG. 2 is a diagram illustrating an example of a vapor pressure curve of the first processing gas according to the embodiment. FIG. 2 illustrates a vapor pressure curve of C4F8 as the first process gas. The saturated vapor pressure of C4F8 increases with increasing temperature. Therefore, as the temperature of the wafer W increases, the adsorbate based on C4F8 is hardly physically adsorbed on the film to be etched. Thus, there is an upper limit on the temperature of the wafer W that causes a sufficient amount of physical adsorption to contribute to etching, and the etching apparatus 10 cools the wafer W to a temperature lower than the upper limit. When C4F8 is used as the first processing gas, the etching apparatus 10 of the present embodiment cools the wafer W to a temperature of, for example, −115° C. or lower.

When the pressure of C4F8 is smaller than the saturated vapor pressure with respect to the temperature of the wafer W, the adsorption amount of the adsorbate physically adsorbed on the film to be etched is saturated to a constant value with the lapse of time. This phenomenon is called adsorption equilibrium. The etching apparatus 10 of the present embodiment physically adsorbs the adsorbate based on C4F8 on the film to be etched under the condition that the pressure of C4F8 is smaller than the saturated vapor pressure of C4F8 with respect to the temperature of the wafer W while cooling the wafer W. For example, the etching apparatus 10 physically adsorbs the adsorbate based on C4F8 on the film to be etched under the condition that the pressure of C4F8 is smaller than the saturated vapor pressure of C4F8 with respect to the temperature of the wafer W, while cooling the wafer W to a temperature of −115° C. or lower. FIG. 2 illustrates that the range of the pressure of C4F8 set when the temperature of the wafer W is −115° C. or lower is in the shaded area. Physically adsorbing the adsorbate on the film to be etched under the condition that the pressure of C4F8 is smaller than the saturated vapor pressure while cooling the wafer W allows the adsorption amount of the adsorbate to be saturated to a constant value with the lapse of time, so that the thickness of the adsorbate can be controlled with high accuracy in atomic layer units. Thus, the etching amount of the film to be etched by reacting with the adsorbate can be appropriately controlled to a desired amount.

A specific example of the flow of etching the wafer W will then be described with reference to FIG. 3. FIG. 3 is a diagram illustrating an example of temporal changes in the film thickness of the wafer W according to the embodiment. A graph on the upper side in FIG. 3 illustrates the temporal changes in the film thickness of the wafer W when the physical adsorption process, the adjustment process, and the etching process are sequentially repeated for eight cycles. On the lower side in FIG. 3, a portion corresponding to the seventh cycle of the upper graph in FIG. 3 is illustrated in an enlarged form. An SiO2 film is formed on the wafer W as the film to be etched.

The etching apparatus 10 circulates a refrigerant to cool the wafer W to −120° C. The etching apparatus 10 then supplies C4F8 from the gas source group 40 into the chamber 12 under the condition that the pressure of C4F8 is smaller than the saturated vapor pressure of C4F8 with respect to the temperature of the wafer W to physically adsorb the adsorbate on the film to be etched, while cooling the wafer W. In such a case, the etching apparatus 10 does not generate plasma in the chamber 12. FIG. 3 illustrates a period T1 during which the physical adsorption process of the seventh cycle is performed. In the wafer W, the adsorption amount of the adsorbate physically adsorbed on the film to be etched is saturated to a constant value with the lapse of time, and the film thickness of the wafer W is saturated to a constant value. In other words, the physical adsorption process is continued for a predetermined time (e.g., for the period T1) until the adsorption amount of the adsorbate is saturated. The etching apparatus 10 may adjust the temperature of the wall of the chamber 12 to a value higher than the temperature of the wafer W when physically adsorbing the adsorbate on the film to be etched. The adjustment of the temperature of the wall of the chamber 12 is performed by using a heating means such as a heater. Adjusting the temperature of the wall of the chamber 12 to a value higher than the temperature of the wafer W allows the adsorption amount of the adsorbate physically adsorbed on the wall of the chamber 12 to be reduced.

The etching apparatus 10 physically adsorbs the adsorbate based on C4F8 on the film to be etched, and then supplies Ar from the gas source group 40 into the chamber 12 to replace C4F8 with Ar. FIG. 3 illustrates a period T2 during which the replacement process of the seventh cycle is performed. When C4F8 is replaced with Ar, the partial pressure of C4F8 decreases, and a part of the adsorbate physically adsorbed on the film to be etched is volatilized. As a part of the adsorbate physically adsorbed on the film to be etched is volatilized, the adsorption amount of the adsorbate decreases in the wafer W and the thickness of the wafer W decreases. However, the other part of the adsorbate remains as a residue on the film to be etched without being volatilized. Thus, the thickness of the adsorbate is adjusted to a predetermined thickness.

The etching apparatus 10 replaces C4F8 with Ar, then supplies Ar from the gas source group 40 into the chamber 12, and applies the first high-frequency power from the first high-frequency power source 62 to the upper electrode 30 to generate a plasma of Ar in the chamber 12 for etching. In such a case, the etching apparatus 10 may apply the second high-frequency power from the second high-frequency power source 64 to the lower electrode 18. FIG. 3 illustrates a period T3 during which the etching process of the seventh cycle is performed. The generation of a plasma of Ar accelerates the collision of Ar ions with the adsorbate on the film to be etched, and causes the reaction of the adsorbate with the film to be etched. By the reaction of the adsorbate with the film to be etched, the film to be etched is etched according to the thickness of the adsorbate in the wafer W, and thus the thickness of the film to be etched decreases with the lapse of time, and the thickness of the wafer W decreases. When the reaction of the adsorbate with the film to be etched is completed, the reduction of the thickness of the film to be etched is stopped. In other words, the etching process is continued until the reaction of the adsorbate with the film to be etched is completed.

As described above, the etching apparatus 10 can saturate the adsorption amount of the adsorbate to a constant value by physically adsorbing the adsorbate on the film to be etched under the condition that the pressure of C4F8 is smaller than the saturated vapor pressure of C4F8 with respect to the temperature of the wafer W while cooling the wafer W. Thus, the etching apparatus 10 can control the thickness of the adsorbate with high accuracy in atomic layer units, and consequently can appropriately control the etching amount of the film to be etched by reacting with the adsorbate to a desired amount.

In the etching apparatus 10, even when the adsorbate is physically adsorbed on the film to be etched, all the adsorbates may be volatilized before etching the film to be etched is performed. For example, in the etching apparatus 10, if the temperature of the wafer W is relatively high (e.g., temperature above −115° C.), all the adsorbates based on C4F8 physically adsorbed on the SiO2 film may be volatilized before etching is performed. If all the adsorbates are volatilized before etching is performed, the reaction of the adsorbates with the film to be etched is not realized, so that etching of the film to be etched is not realized.

FIG. 4 is a graph illustrating the result of measuring temporal changes in the thickness of the adsorbate on the $SiO_2$ film by an ellipsometer when the temperature of the wafer W is −110° C. FIG. 5 is a graph illustrating the result of measuring temporal changes in the intensity of a gas component near the SiO2 film by QMS (Quadrupole Mass Spectrometer) when the temperature of the wafer W is −110° C. FIGS. 4 and 5 are the results of measuring the thickness of the adsorbate on the SiO2 film and the intensity of the gas component near the SiO2 film by changing the pressure of C4F8 supplied into the chamber 12. FIGS. 4 and 5 graphically illustrate, for each pressure of C4F8, the temporal changes in the thickness of the adsorbate on the SiO2 film and the temporal changes in the intensity of the gas component near the SiO2 film.

The graph in FIG. 4 illustrates that, when the temperature of the wafer W is −110° C., the adsorbate based on C4F8 is physically adsorbed on the SiO2 film by C4F8 being supplied into the chamber 12. The graph in FIG. 5 illustrates that, when the temperature of the wafer W is −110° C., all the adsorbates physically adsorbed once on the SiO2 film are rapidly volatilized as gas components after the exhaust of C4F8 is started.

Figure 6:
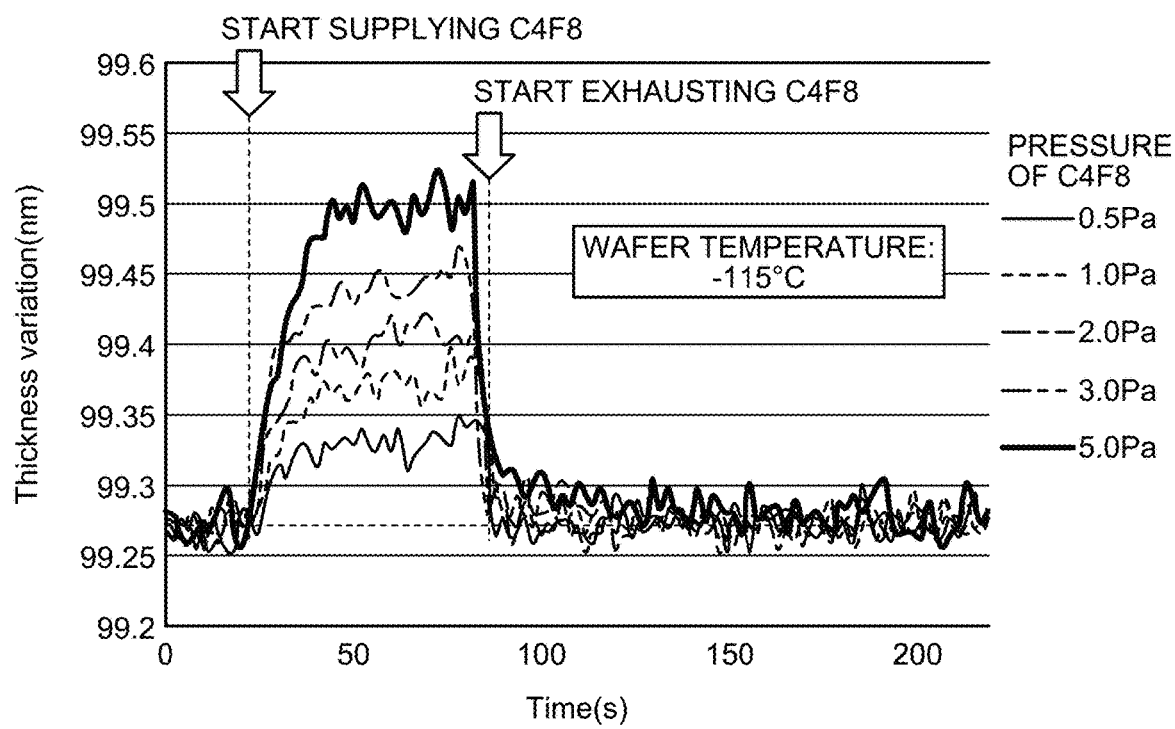
FIG. 6 is a graph illustrating the result of measuring temporal changes in the thickness of the adsorbate on the SiO2 film by an ellipsometer when the temperature of the wafer is −115° C.
Figure 7:
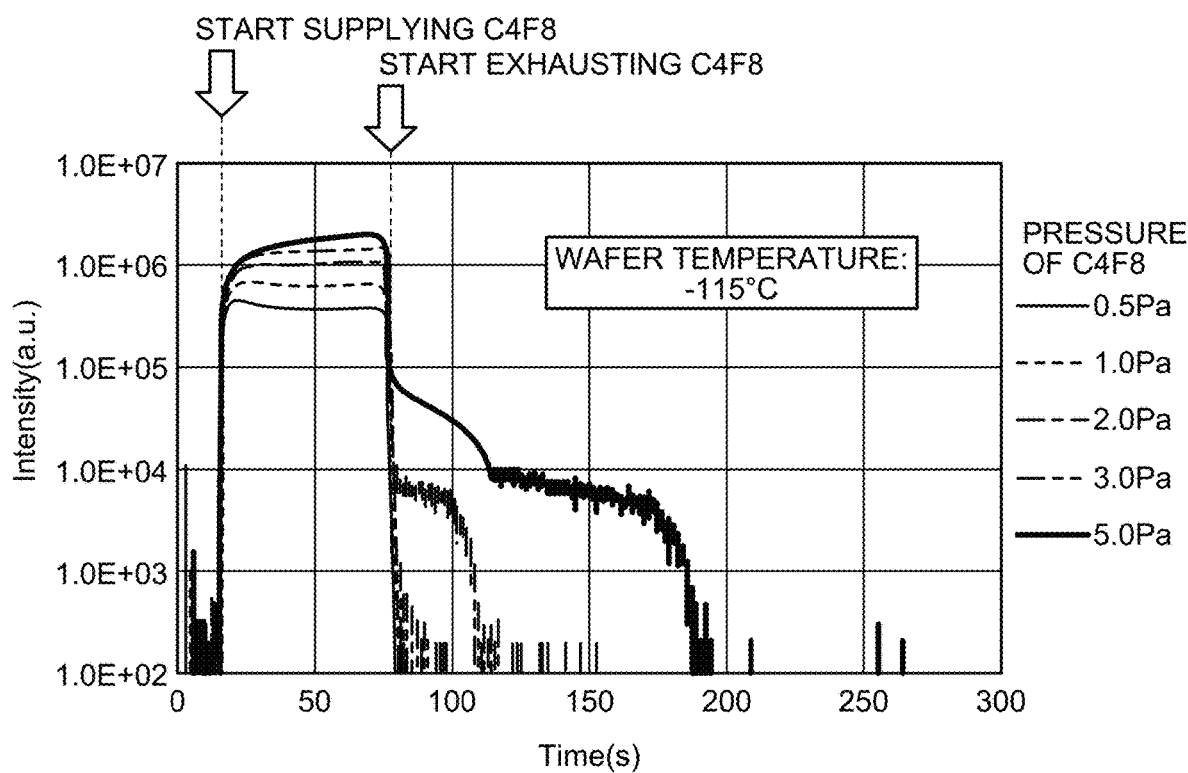
FIG. 7 is a graph illustrating the result of measuring temporal changes in the intensity of the gas component near the SiO2 film by QMS when the temperature of the wafer is −115° C.

FIG. 6 is a graph illustrating the result of measuring temporal changes in the thickness of the adsorbate on the SiO2 film by an ellipsometer when the temperature of the wafer W is −115° C. FIG. 7 is a graph illustrating the result of measuring temporal changes in the intensity of the gas component near the SiO2 film by QMS when the temperature of the wafer W is −115° C. FIGS. 6 and 7 are the results of measuring the thickness of the adsorbate on the SiO2 film and the intensity of the gas component near the SiO2 film by changing the pressure of C4F8 supplied into the chamber 12. FIGS. 6 and 7 graphically illustrate, for each pressure of C4F8, the temporal changes in the thickness of the adsorbate on the SiO2 film and the temporal changes in the intensity of the gas component near the SiO2 film.

The graph in FIG. 6 illustrates that, when the temperature of the wafer W is −115° C., the adsorbate based on C4F8 is physically adsorbed on the SiO2 film by C4F8 being supplied into the chamber 12. The graph in FIG. 7 illustrates that, when the temperature of the wafer W is −115° C., the adsorbates once physically adsorbed on the SiO2 film are slowly volatilized as gas components after the exhaust of C4F8 is started. FIGS. 4, 5, 6, and 7 illustrate that, when the temperature of the wafer W is −115° C., it is possible to increase the time in which the adsorbate once physically adsorbed on the SiO2 film remains on the SiO2 film in comparison with the case where the temperature of the wafer W is −110° C.

Figure 8:
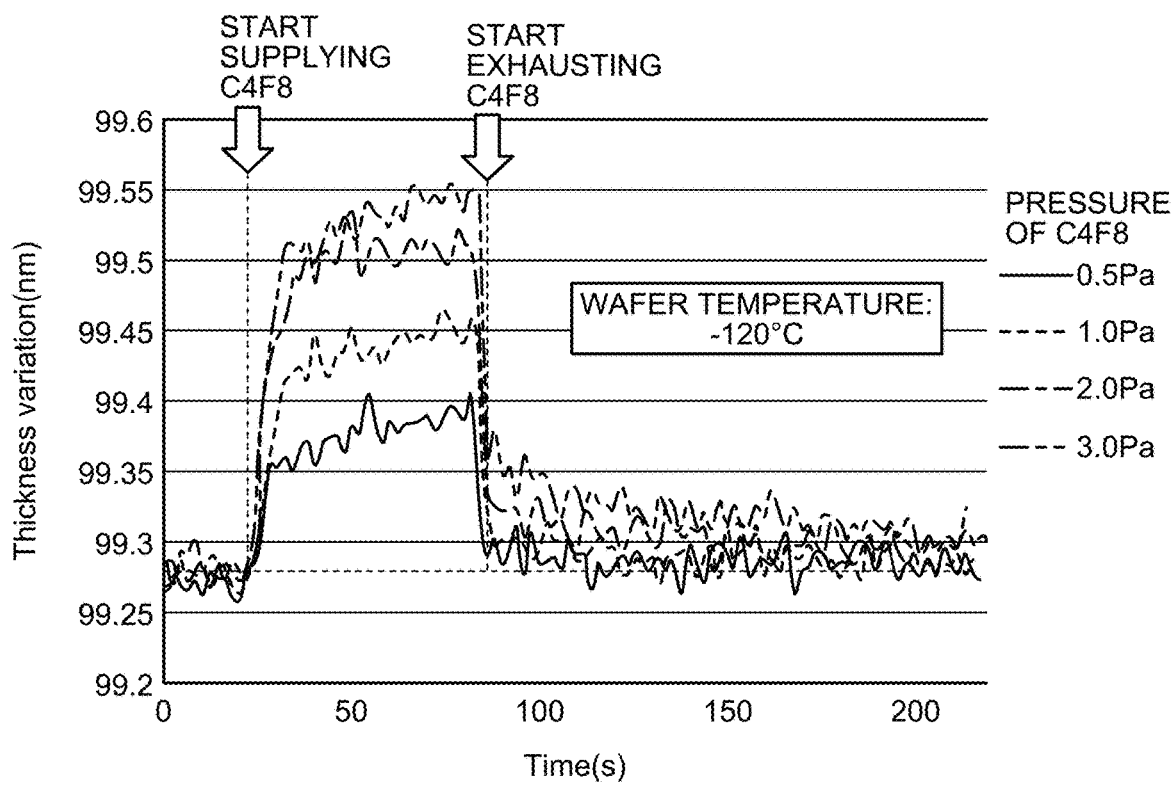
FIG. 8 is a graph illustrating the result of measuring temporal changes in the thickness of the adsorbate on the SiO2 film by an ellipsometer when the temperature of the wafer is −120° C.
Figure 9:
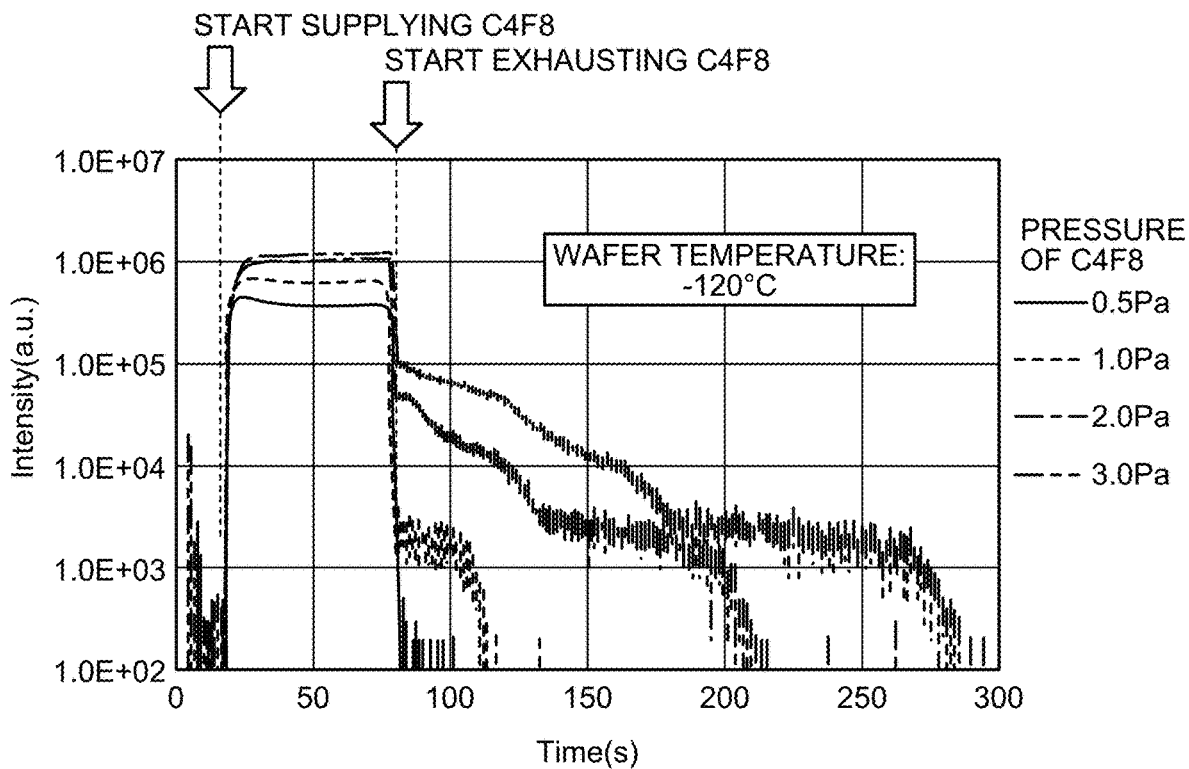
FIG. 9 is a graph illustrating the result of measuring temporal changes in the intensity of the gas component near the SiO2 film by QMS when the temperature of the wafer is −120° C.

FIG. 8 is a graph illustrating the result of measuring temporal changes in the thickness of the adsorbate on the SiO2 film by an ellipsometer when the temperature of the wafer W is −120° C. FIG. 9 is a graph illustrating the result of measuring temporal changes in the intensity of the gas component near the SiO2 film by QMS when the temperature of the wafer W is −120° C. FIGS. 8 and 9 are the results of measuring the thickness of the adsorbate on the SiO2 film and the intensity of the gas component near the SiO2 film by changing the pressure of C4F8 supplied into the chamber 12. FIGS. 8 and 9 graphically illustrate, for each pressure of C4F8, the temporal changes in the thickness of the adsorbate on the SiO2 film and the temporal changes in the intensity of the gas component near the SiO2 film.

The graph in FIG. 8 illustrates that, when the temperature of the wafer W is −120° C., the adsorbate based on C4F8 is physically adsorbed on the SiO2 film by C4F8 being supplied into the chamber 12. The graph in FIG. 9 illustrates that, when the temperature of the wafer W is −120° C., the adsorbates once physically adsorbed on the SiO2 film are slowly volatilized as gas components after the exhaust of C4F8 is started. FIGS. 6, 7, 8, and 9 illustrate that, when the temperature of the wafer W is −120° C., it is possible to increase the time in which the adsorbate once physically adsorbed on the SiO2 film remains on the SiO2 film in comparison with the case where the temperature of the wafer W is −115° C.

Therefore, the etching apparatus 10 of the present embodiment physically adsorbs the adsorbate on the film to be etched while cooling the wafer W to a temperature of −115° C. or lower. Thus, a situation in which all the adsorbates are volatilized can be avoided before etching is performed, so that etching of the film to be etched can be stably achieved.

However, even when the wafer W is cooled to a temperature of −115° C. or lower, if the pressure of the first processing gas C4F8 is sufficiently lower than the saturated vapor pressure of C4F8 with respect to the temperature of the wafer W, the adsorbate based on C4F8 is easily volatilized. For example, when the pressure of C4F8 is less than 0.5 Pa, the adsorbate based on C4F8 is easily volatilized. Therefore, the etching apparatus 10 of the present embodiment physically adsorbs the adsorbate on the film to be etched under the condition that the pressure of the first processing gas is a predetermined lower limit value or more according to the type of the first processing gas and is smaller than the saturated vapor pressure of the first processing gas. For example, when the first processing gas is C4F8, a predetermined lower limit value according to the type of the first processing gas is, for example, 0.5 Pa. The volatilization of the adsorbate can be suppressed by setting the pressure of the first processing gas to a predetermined lower limit value or more according to the type of the first processing gas.

The flow of the etching method according to the present embodiment will then be briefly described. FIG. 10 is a flowchart illustrating an example of the flow of the etching method according to the embodiment.

The etching apparatus 10 circulates a refrigerant between the flow channel 18f and the chiller unit to cool the stage 16 and the wafer W to −115° C. or lower (step S11).

The etching apparatus 10 supplies C4F8 from the gas source group 40 into the chamber 12 under the condition that the pressure of C4F8 is smaller than the saturated vapor pressure of C4F8 with respect to the temperature of the wafer W to physically adsorb the adsorbate on the film to be etched, while cooling the wafer W (step S12). Step S12 is an example of the physical adsorption process. C4F8 in step S12 is an example of the first processing gas.

The etching apparatus 10 supplies Ar from the gas source group 40 into the chamber 12 to replace C4F8 with Ar (step S13). When C4F8 is replaced with Ar, the partial pressure of C4F8 decreases, and a part of the adsorbate physically adsorbed on the film to be etched is volatilized. The other part of the adsorbate remains as a residue on the film to be etched without being volatilized. Thus, the thickness of the adsorbate is adjusted to a predetermined thickness. Step S13 is an example of the replacement process. Ar in step S13 is an example of the third processing gas.

The etching apparatus 10 applies a first high-frequency power from the first high-frequency power source 62 to the upper electrode 30 to generate a plasma of Ar in the chamber 12 and etches the film to be etched, while supplying Ar from the gas source group 40 into the chamber 12 (step S14). Step S14 is an example of an etching process. Ar in step S14 is an example of the second processing gas.

The etching apparatus 10 determines whether or not steps S12 to S14 are repeated for a plurality of cycles (step S15). If steps S12 to S14 are not repeated for a plurality of cycles (step S15 No), the etching apparatus 10 proceeds to step S12. Thus, the physical adsorption process, the replacement process, and the etching process are repeated for a plurality of cycles.

On the other hand, if steps S12 to S14 are executed for a plurality of cycles (step S15 Yes), the etching apparatus 10 terminates the etching method.

As described above, the etching method according to the present embodiment includes a physical adsorption process and an etching process. The physical adsorption process physically adsorbs the adsorbate based on the first processing gas on the film to be etched under the condition that the pressure of the first processing gas is smaller than the saturated vapor pressure of the first processing gas with respect to the temperature of the object to be processed while cooling the object to be processed on which the film to be etched is formed. The etching process etches the film to be etched by reacting the adsorbate with the film to be etched by the plasma of the second processing gas. Thus, the thickness of the adsorbate can be controlled with high accuracy in atomic layer units, and consequently the etching amount of the film to be etched by reacting with the adsorbate can be appropriately controlled to a desired amount. Thus, the uniformity of the etching amount in the plane of the object to be processed is improved, and the variation of the etching amount for each object to be processed can be suppressed.

In the etching method according to the present embodiment, the physical adsorption process adjusts the temperature of the wall of the chamber in which the object to be processed is disposed to a value higher than the temperature of the object to be processed, when physically adsorbing the adsorbate on the film to be etched. Thus, the adsorption amount of the adsorbate physically adsorbed on the wall of the chamber can be reduced.

In the etching method according to the present embodiment, the physical adsorption process is continued until the adsorption amount of the adsorbate is saturated. Thus, the thickness of the adsorbate can be controlled to a desired thickness.

In the etching method according to the present embodiment, the physical adsorption process and the etching process are repeated for a plurality of cycles. Thus, the etching amount in each repeated cycle can be controlled to a desired amount.

The etching method according to the present embodiment further includes a replacement process of replacing the first processing gas with the third processing gas. Thus, the occurrence of etching failure due to the influence of the residual gas can be suppressed.

In the etching method according to the present embodiment, the third processing gas is identical to the second processing gas. Thus, the occurrence of etching failure caused by the switching of the processing gas can be suppressed.

In the etching method according to the present embodiment, the etching process is continued until the reaction of the adsorbate with the film to be etched is completed. Thus, self-controlled etching can be realized.

In the etching method according to the present embodiment, the first processing gas includes a CF-based gas. Thus, the etching amount of the film to be etched by reacting with the adsorbate based on the CF-based gas can be appropriately controlled to a desired amount.

In the etching method according to the present embodiment, the physical adsorption process physically adsorbs the adsorbate on the film to be etched while cooling the object to be processed to a temperature of −115° C. or lower. Thus, a situation in which all the adsorbates are volatilized can be avoided before etching is performed, so that etching of the film to be etched can be stably achieved.

In the etching method according to the present embodiment, the physical adsorption process physically adsorbs the adsorbate on the film to be etched under the condition that the pressure of the first processing gas is a predetermined lower limit value or more according to the type of the first processing gas and is smaller than the saturated vapor pressure of the first processing gas. Thus, the volatilization of the adsorbate can be suppressed.

In the etching method according to the present embodiment, the first processing gas is C4F8, and the pressure of the first processing gas is 0.5 Pa or more. Thus, the volatilization of the adsorbate based on C4F8 can be suppressed.

In the etching method according to the present embodiment, the second processing gas includes a rare gas. Thus, the adsorbate can be reacted with the film to be etched by the plasma of the rare gas.

Others

The techniques disclosed herein are not limited to the embodiments described above, but may be modified in a number of ways within the spirit and scope of the invention.

For example, in the embodiments described above, the physical adsorption process is performed in one step, but may be performed in two steps. For example, the physical adsorption process may include a first process and a second process. The first process physically adsorbs the adsorbate under the condition that the pressure of the first processing gas is higher than the pressure of saturating the adsorption amount of the adsorbate. The second process physically adsorbs the adsorbate under the condition that the pressure of the first processing gas is a pressure of saturating the adsorption amount of the adsorbate. Thus, the time required for the adsorption amount of the adsorbate to be saturated to a constant value can be shortened.

In the embodiment described above, when the physical adsorption process and the etching process are repeated, the pressure of the first processing gas and the temperature of the object to be processed (wafer W) are not changed, but the disclosed technique is not limited thereto. For example, at least one of the pressure of the first processing gas and the temperature of the object to be processed may be changed each time the physical adsorption process and the etching process are repeated. Thus, the etching amount can be changed with the progress of etching.

The embodiment described above illustrates an example that the replacement process of replacing the first processing gas with the third processing gas is performed between the physical adsorption process and the etching process, but the disclosed technique is not limited thereto. For example, an exhaust process of exhausting the first processing gas may be included between the physical adsorption process and the etching process.

In the embodiment described above, the exhaust process of exhausting the second processing gas after the etching process may be included. In the embodiment described above, the replacement process of replacing the second processing gas with the fourth processing gas after the etching process may be included.

The present disclosure has an effect that can appropriately control an etching amount.

Note that the embodiments disclosed herein are illustrative in all respects and should not be considered restrictive. The embodiment described above can indeed be embodied in a variety of forms. The above embodiment may be omitted, replaced, or modified in various forms without departing from the scope and spirit of the appended claims.

What is claimed is:

1. An etching method comprising:
   a physical adsorption process of physically adsorbing an adsorbate based on a first processing gas on a film to be etched, with a chemical reaction for etching the film by the first processing gas being not held, under a condition that a pressure of the first processing gas is smaller than a saturated vapor pressure of the first processing gas with respect to a temperature of an object to be processed while cooling the object to be processed on which the film to be etched is formed;
   a replacement process of replacing the first processing gas with a third processing gas volatilizing a part of the adsorbate to adjust a thickness of the adsorbate without igniting a plasma of the third processing gas; and
   an etching process of etching the film to be etched by reacting the adsorbate with the film to be etched by a plasma of a second processing gas.

2. The etching method according to claim 1, wherein the physical adsorption process adjusts a temperature of a wall of a chamber in which the object to be processed is disposed to a value higher than a temperature of the object to be processed, when physically adsorbing the adsorbate on the film to be etched.

3. The etching method according to claim 1, wherein the physical adsorption process is continued until an adsorption amount of the adsorbate is saturated.

4. The etching method according to claim 1, wherein the physical adsorption process includes:
   a first process of physically adsorbing the adsorbate under a condition that a pressure of the first processing gas is higher than a pressure of saturating an adsorption amount of the adsorbate; and
   a second process of physically adsorbing the adsorbate under a condition that the pressure of the first processing gas is the pressure of saturating the adsorption amount of the adsorbate.

5. The etching method according to claim 1, wherein the physical adsorption process and the etching process are repeated for a plurality of cycles.

6. The etching method according to claim 5, wherein each time the physical adsorption process and the etching process are repeated, at least one of a pressure of the first processing gas and a temperature of the object to be processed is changed in the physical adsorption process.

7. The etching method according to claim 1, further comprising an exhaust process of exhausting the first processing gas between the physical adsorption process and the etching process.

8. The etching method according to claim 1, wherein the third processing gas is identical to the second processing gas.

9. The etching method according to claim 1, wherein the etching process is continued until a reaction of the adsorbate with the film to be etched is completed.

10. The etching method according to claim 1, further comprising an exhaust process of exhausting the second processing gas after the etching process.

11. The etching method according to claim 1, further comprising a replacement process of replacing the second processing gas with a fourth processing gas after the etching process.

12. The etching method according to claim 1, wherein the first processing gas includes a CF-based gas that contains only C and F.

13. The etching method according to claim 1, wherein the physical adsorption process physically adsorbs the adsorbate on the film to be etched while cooling the object to be processed to a temperature of −115° C. or lower.

14. The etching method according to claim 1, wherein the physical adsorption process physically adsorbs the adsorbate on the film to be etched under a condition that a pressure of the first processing gas is a predetermined lower limit value or more according to a type of the first processing gas and is smaller than the saturated vapor pressure of the first processing gas.

15. The etching method according to claim 14, wherein
the first processing gas is C4F8, and
a pressure of the first processing gas is 0.5 Pa or more.

16. The etching method according to claim 1, wherein the second processing gas includes a rare gas.

* * * * *